(12) United States Patent
Wirnitzer et al.

(10) Patent No.: US 8,130,498 B2
(45) Date of Patent: Mar. 6, 2012

(54) HEAT SINK OF AT LEAST ONE ELECTRONIC COMPONENT

(75) Inventors: Bernd Wirnitzer, Friolzheim (DE); Jan Breitenbach, Stuttgart (DE); Andreas Kynast, Stuttgart (DE); Thorsten Seidel, Remseck am Neckar (DE)

(73) Assignee: Robert Bosch GmbH, Stuttgart (DE)

( * ) Notice: Subject to any disclaimer, the term of this patent is extended or adjusted under 35 U.S.C. 154(b) by 0 days.

(21) Appl. No.: 12/808,061

(22) PCT Filed: Nov. 11, 2008

(86) PCT No.: PCT/EP2008/065301
§ 371 (c)(1),
(2), (4) Date: Jun. 14, 2010

(87) PCT Pub. No.: WO2009/077268
PCT Pub. Date: Jun. 25, 2009

(65) Prior Publication Data
US 2010/0265661 A1 Oct. 21, 2010

(30) Foreign Application Priority Data
Dec. 14, 2007 (DE) .......................... 10 2007 060 249

(51) Int. Cl.
*H05K 7/20* (2006.01)

(52) U.S. Cl. .............. 361/704; 361/679.46; 361/679.54; 361/709; 361/718; 361/719; 165/80.3; 165/104.33; 165/185; 174/16.3; 174/252

(58) Field of Classification Search ............. 361/679.46, 361/679.54, 702–712, 715, 719–724; 257/706–727; 165/80.2, 80.3, 104.33, 185; 174/15.1, 16.3, 174/252
See application file for complete search history.

(56) References Cited

U.S. PATENT DOCUMENTS

| | | | | |
|---|---|---|---|---|
| 3,572,428 A * | 3/1971 | Monaco | ....................... | 165/80.3 |
| 4,054,901 A | 10/1977 | Edwards et al. | | |
| 4,537,246 A * | 8/1985 | Lloyd | ........................... | 165/80.2 |
| 4,552,206 A | 11/1985 | Johnson et al. | | |
| 4,605,058 A * | 8/1986 | Wilens | ......................... | 165/80.2 |
| 4,609,040 A * | 9/1986 | Moore | ......................... | 165/80.3 |
| 4,663,695 A * | 5/1987 | Ohkawara et al. | ........... | 361/773 |
| 4,729,426 A * | 3/1988 | Hinshaw | ....................... | 165/80.3 |
| 4,872,505 A * | 10/1989 | Jones et al. | ................... | 165/80.3 |
| 4,961,125 A | 10/1990 | Jordan et al. | | |
| 5,019,942 A * | 5/1991 | Clemens | ....................... | 361/709 |
| 5,040,096 A | 8/1991 | Churchill et al. | | |
| 5,068,764 A | 11/1991 | Bland et al. | | |
| 5,381,041 A | 1/1995 | Harmon | | |
| 5,844,312 A * | 12/1998 | Hinshaw et al. | .............. | 257/718 |
| 5,995,369 A * | 11/1999 | Kiermeier et al. | ............ | 361/704 |
| 6,580,612 B2 * | 6/2003 | Draad et al. | ................... | 361/719 |
| 2004/0206476 A1 | 10/2004 | Lee | | |
| 2006/0158857 A1 | 7/2006 | Luckner et al. | | |

FOREIGN PATENT DOCUMENTS

| | | |
|---|---|---|
| FR | 2780456 A1 | 12/1999 |
| GB | 2243026 A | 10/1991 |

* cited by examiner

*Primary Examiner* — Michail V Datskovskiy
(74) *Attorney, Agent, or Firm* — Ronald E. Greigg

(57) ABSTRACT

The invention relates to a cooling body of at least one electrical component. According to the invention, a first cooling body section is designed as a spring and a contact surface is provided on the first cooling body section, between the cooling body and the at least one component.

9 Claims, 2 Drawing Sheets

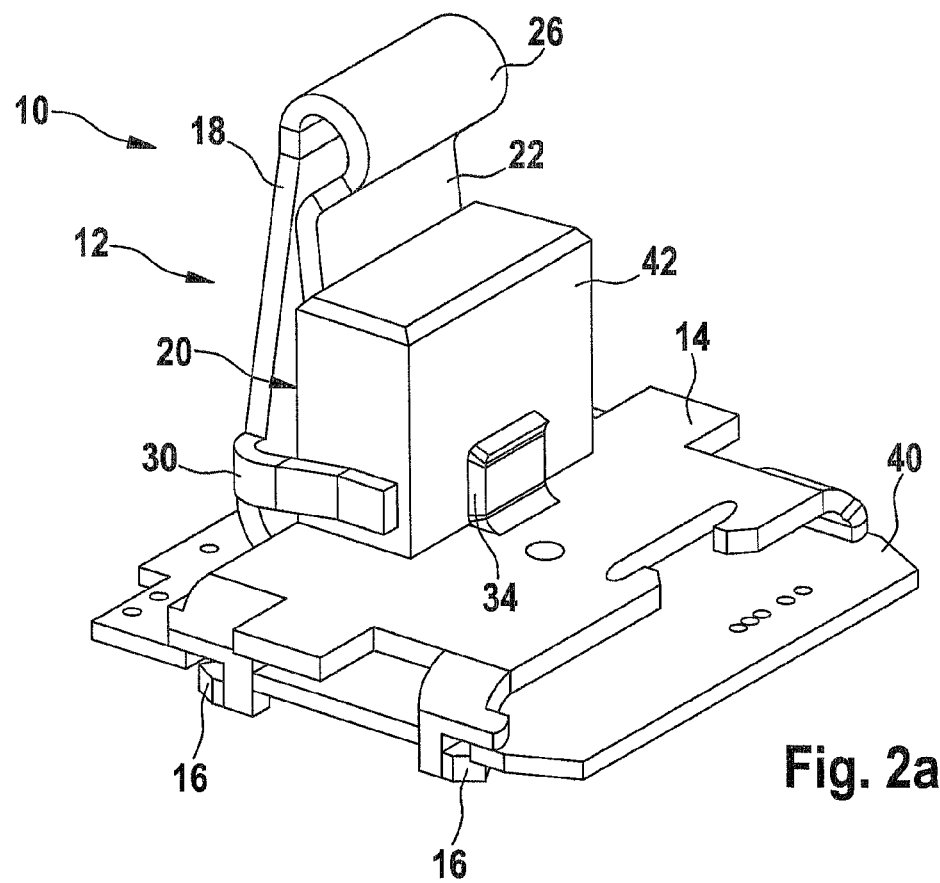
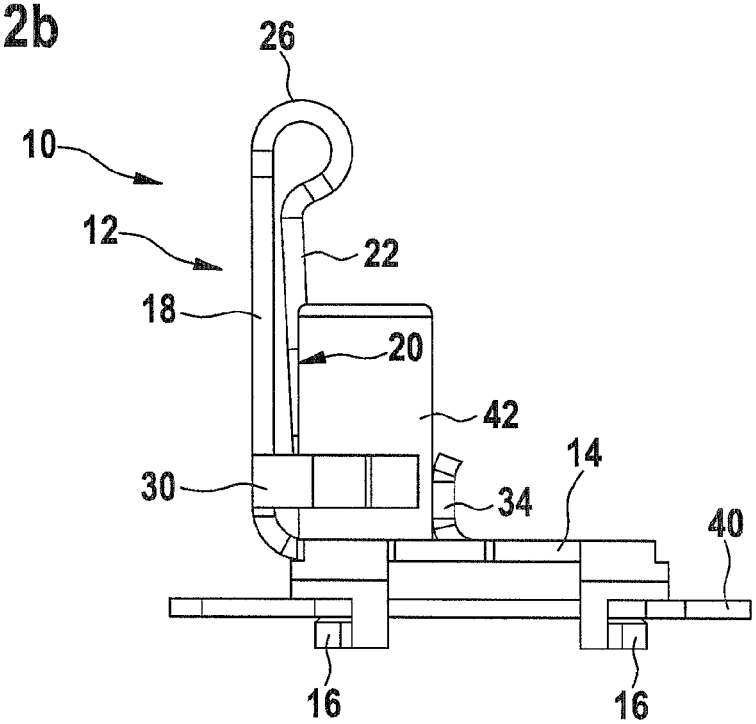

HEAT SINK OF AT LEAST ONE ELECTRONIC COMPONENT

CROSS-REFERENCE TO RELATED APPLICATION

This application is a 35 USC 371 application of PCT/EP2008/065301 filed on Nov. 11, 2008.

BACKGROUND OF THE INVENTION

1. Field of the Invention

The invention is based on a heat sink of at least one electrical component.

2. Description of the Prior Art

It is known to mount heat sinks on electrical power components, to ensure adequate heat dissipation from the power component. Typically, such heat sinks comprise a face, which establishes large-area contact with the power component, and fins protruding transversely from that face which effectively increase the surface area of the heat sink and improve the heat dissipation. Often, the heat sink is joined to the power component by a heat-conducting paste or a potting composition. In the event of vibration or major fluctuations in acceleration, damage to the power component can occur.

ADVANTAGES AND SUMMARY OF THE INVENTION

It is proposed that a first heat sink portion is embodied as a spring, and a contact face is provided in the first heat sink portion, between the heat sink and the at least one component.

Advantageously, an electrical component joined to the heat sink on the first heat sink portion can be protected by the spring action of the heat sink portion, for instance in the event of vibration, impact, or fluctuations in acceleration. In the event of deformation, for instance after major fluctuations in acceleration, the spring action of the heat sink can halt the electrical component and return it to the original position. Advantageously, the first heat sink portion can be joined to a second heat sink portion in such a way that this first heat sink portion is deflectable, for instance resiliently, relative to the second heat sink portion. Thus the first heat sink portion can be angled relative to the second heat sink portion or joined to it by a spring element. If the second heat sink portion is rigidly fixed, then impacts or vibration can be absorbed by the first heat sink portion. A plurality of components to be cooled can be disposed on the heat sink, and at least one of the components is attached mechanically as described, and as a result is attached thermally.

The first heat sink portion, in a preferred feature, can be angled transversely to a second heat sink portion, and in the mounted state the second heat sink portion is intended for being secured to a circuit board. The first heat sink portion can be moved flexibly counter to the second heat sink portion. Vibration can easily be cushioned by spring action.

In a preferred refinement, the second heat sink portion can be secured in the mounted state to a circuit board by at least one securing element. Preferably, the circuit board can be firmly clamped. Thus a screw connection, for instance, which requires additional securing elements and is time-consuming to produce, can be advantageously avoided. The at least one securing element can preferably be embodied as a detent or as a crimped foot and can engage corresponding recesses in the circuit board. As a result, a mechanical hold of the heat sink on the circuit board can be attained without additional securing elements. Solid cohesion of the circuit board and heat sink can be attained with and without additional potting composition. However, the securing can also be done in such a way that the circuit board can be slid in on the heat sink portion. Fixation against shifting can be ensured, for instance by means of a potting composition that is disposed for instance above the connection point of the circuit board and the heat sink portion.

In an advantageous feature, the first heat sink portion can be embodied in hooplike form, with a first leg and a second leg. As a result of the hooplike embodiment, an advantageous spring action of the heat sink can be reinforced. As a result of this embodiment, a secure, reliable two-dimensional contact of the heat sink with the at least one component, and thus both a secure fixation of the at least one component and reliable heat dissipation can be ensured. A reliable connection with the at least one component can be made, and an advantageous compact, narrow structural shape of the heat sink can be achieved.

Advantageously, the first heat sink portion can be firmly clampable to the at least one component. Favorably, the first heat sink portion, for instance, can be provided for contact with a main face of the at least one component. Laterally on the heat sink portion, two guide elements may be embodied, which for instance firmly hold opposed side faces of the component and serve for instance to guide the at least one component.

In an expedient feature, the contact face can be disposed on an inner side of at least one of the legs. Then the at least one component can be disposed in a hollow space between the legs. Advantageously, the at least one component can be clampable between the first and the second leg. The heat transfer can be ensured by the clamping force of the two legs, and the at least one component can be securely fixed. It is also conceivable for further electrical components to be secured, for instance screwed, to one or both legs. For instance, the component disposed between the legs may be a capacitor, while other components, such as field effect transistors, can be disposed on the outer side of one or both legs.

In an alternative feature, the contact face can be disposed on an outer side of one of the legs. The heat transfer can be ensured by a contact pressure between the at least one component and the heat sink. Advantageously, in the mounted state, the at least one component can be clampable between the contact face on the outer side of one of the legs and a further clamping portion in the heat sink. Favorably, the clamping portion can be stamped out from the heat sink and suitably bent in a curve. Here as well, further electrical components may be disposed on the first heat sink portion, on its outer side, for instance being screwed to an outer side.

Overall, the heat sink can be inexpensively made as a stamped part, in which the first heat sink portion, the guide elements, the clamping element, and securing elements can be angled in a suitable way. The mounting of the heat sink or of the component can be done quickly and economically.

BRIEF DESCRIPTION OF THE DRAWINGS

Further advantages will become apparent from the ensuing description of the drawings. In the drawings, exemplary embodiments of the invention are shown. The drawings, description and claims include numerous characteristics in combination. One skilled in the art will expediently consider the characteristics individually as well and put them together to make useful further combinations.

The drawings schematically show the following:

FIGS. 2a, b, a preferred embodiment of a heat sink, with an electrical component that is pressed against a heat sink portion, in perspective (FIG. 2a) and in side view (FIG. 2b).

DESCRIPTION OF THE PREFERRED EMBODIMENTS

Figure 1A:
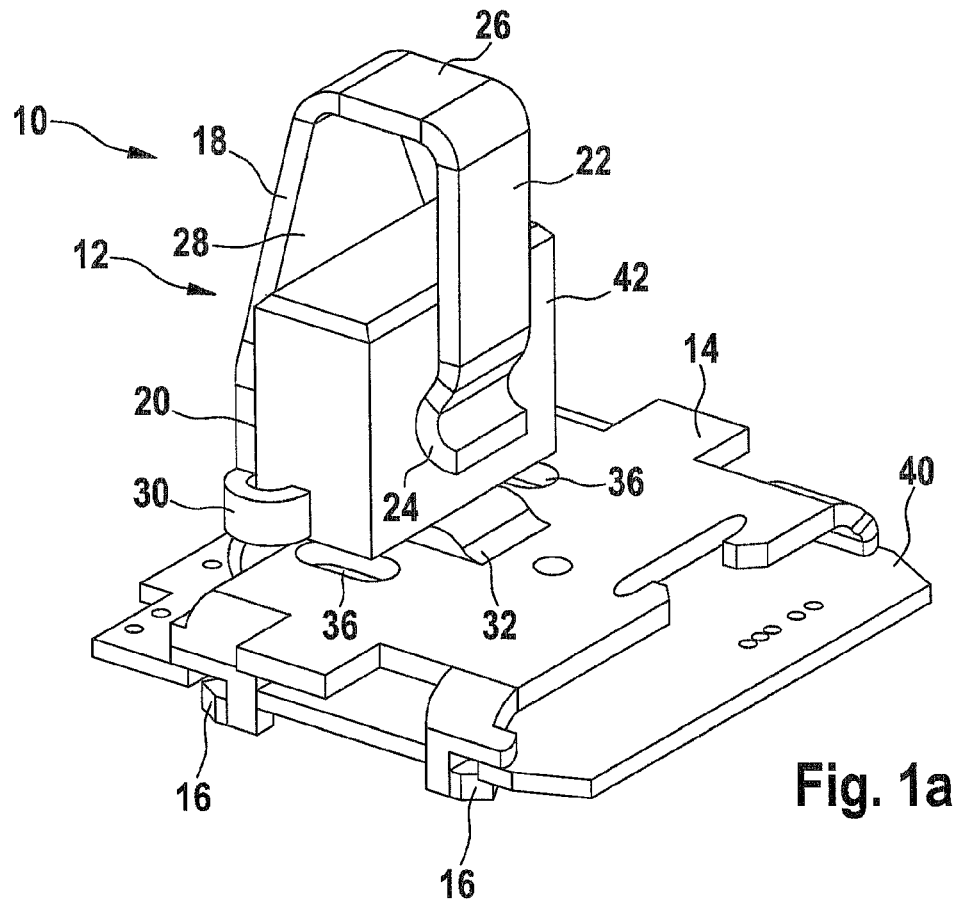
FIGS. 1a, b, a preferred embodiment of a heat sink, with an electrical component that is firmly clamped in a heat sink portion, in perspective (FIG. 1a) and in side view (FIG. 1b)

In the drawings, elements that are identical or have the same function are identified by the same reference numerals.

Figure 1B:
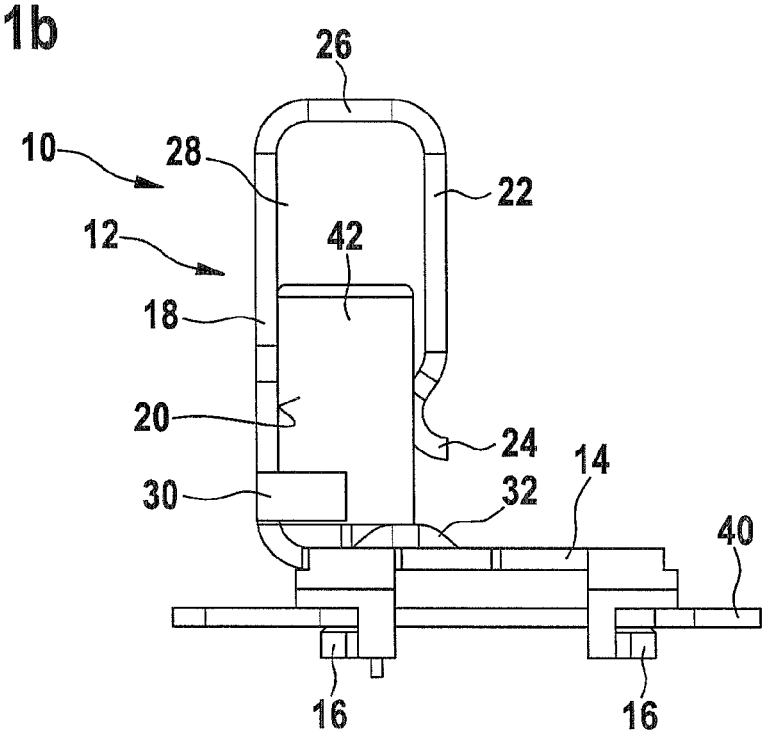

In FIGS. 1a and 1b, a first preferred feature of a heat sink 10 can be seen in perspective (FIG. 1a) and in side view (FIG. 1b). An electrical component 42 mounted on a circuit board 40 is connected to the heat sink 10 for heat dissipation. In the exemplary embodiment shown, a first heat sink portion 12 is embodied as a spring, in that the first heat sink portion 12 is bent at an angle transversely, in particular vertically, from a second heat sink portion 14. The second heat sink portion 14 is embodied in platelike form and is affixed to the circuit board 40 with securing elements 16.

Advantageously, the second heat sink portion 14 can be secured to the circuit board 40 by means of a positive-engagement connection, for instance in this case with so-called crimped feet as securing elements 16, which engage corresponding recesses, not identified by reference numeral, in the circuit board 40. The circuit board 40 can be connected for instance to a further circuit, not shown, or may be a portion of a larger circuit board.

Electrical contacts of the component 42 with the circuit board 40 are extended through suitable openings 36 in the second heat sink portion 14. For heat dissipation, the component 42 is mechanically connected to the first heat sink portion 12. The component 42 is spaced apart somewhat from the main face of the second heat sink portion 14 and is seated on a hump 32 of the second heat sink portion 14.

The first heat sink portion 12 is embodied in hooplike form and has a first leg 18 and a second leg 22, parallel to the first, which are connected by a connecting piece 26. A contact face 20 between the heat sink 10 and the component 42 that acts in a targeted way as a heat diversion face, is provided in the first heat sink portion 12.

The first heat sink portion 12 includes main faces, not identified by reference numeral, of the component 42, and these faces are contacted over a large area by the legs 18, 22, in that with a clamping force, the two legs 18, 22 contact the component 42 disposed in the hollow space 28 between the legs 18, 22. Accordingly, the contact face 20 is disposed on an inner side of the first leg 18. There, the leg 18 rests over a large area on the component 42. The second leg 22 rests with its rounded end piece 24 on the opposite side and presses the component against the first leg 18.

The component 42 can be guided and optionally even held by means of guide elements 30, which are disposed on the heat sink portion 12 and protrude transversely from it. The guide elements 30 are disposed laterally on the first leg 18, engage side faces of the component 42, and serve to guide the component 42.

The component 42 may for instance be a capacitor. In a variant, not shown, further components, such as field effect transistors, can be disposed on, in particular screwed to, the outer side of the leg 18 and/or 22 of the first heat sink portion 12.

The foregoing relates to the preferred exemplary embodiments of the invention, it being understood that other variants and embodiments thereof are possible within the spirit and scope of the invention, the latter being defined by the appended claims.

FIGS. 2a and 2b show an alternative embodiment in perspective (FIG. 2a) and in a side view (FIG. 2b), in which a contact face 20 intended for targeted heat dissipation is disposed on an outer side of one leg 22 of a heat sink 10.

An electrical component 42 mounted on a circuit board 40 is connected for heat dissipation to the heat sink 10. A first heat sink portion 12 is embodied as a spring, in that the first heat sink portion 12 is bent at an angle transversely, in particular vertically, from a second heat sink portion 14. The second heat sink portion 14 is embodied in platelike form and is affixed to the circuit board 40 with securing elements 16.

Advantageously, the second heat sink portion 14 can be secured to the circuit board 40 by means of a positive-engagement connection, for instance in this case with so-called crimped feet as securing elements 16, which engage corresponding recesses, not identified by reference numeral, in the circuit board 40. The circuit board 40 can be connected for instance to a further circuit, not shown, or may be a portion of a larger circuit board.

In the exemplary embodiment shown, in the mounted state, the component 42 can be clamped between the contact face 20 on the outer side of one of the legs 18, 22 and a further clamping portion 34. The clamping portion 34 can be stamped out of the second heat sink portion 14 and curved accordingly.

The first heat sink portion 12 is designed such that the two legs 18, 22 are pressed against one another, while the legs 18, 22 seek to move apart from one another. As a result, a spring force is exerted against the component 42, which the clamping portion 34 counteracts and thus presses the component 42 firmly against the outer side of the second leg 22. As a result of the intimate two-dimensional contact, a good heat transfer from the component 42 to the leg 22 and thus into the heat sink portion 12 can be accomplished.

Here as well, the component 42 is held or guided on the first heat sink portion 12 by means of guide elements 30. The guide elements 30 are disposed laterally on the first leg 18, are angled transversely to it, and engage side faces of the component 42.

The component 42 may for instance be a capacitor. In a variant, not shown, further components, such as field effect transistors, can be disposed on, in particular screwed to, the outer side of the leg 18 and/or 22 of the first heat sink portion 12.

The foregoing relates to the preferred exemplary embodiments of the invention, it being understood that other variants and embodiments thereof are possible within the spirit and scope of the invention, the latter being defined by the appended claims.

The invention claimed is:

1. A heat sink for at least one electrical component wherein:
   the heat sink has a first heat sink portion embodied as a spring;
   a contact face provided on the first heat sink portion, when the heat sink and at least one electrical component are mounted, the contact face contacts the at least one component,
   wherein the first heat sink portion is angled transversely to a second heat sink portion, which in a mounted state is provided for securing to a circuit board, wherein the second heat sink portion can be firmly secured by at least one securing element in the mounted state on a circuit board, and wherein the at least one securing element is embodied as a crimped foot, or as a detent, or wherein the second heat sink portion can be firmly secured by having the circuit board slid onto the second heat sink portion and a potting composition is disposed between the circuit board and the heat sink portion.

2. The heat sink as defined by claim 1, wherein the first heat sink portion is embodied in hooplike form, with a first leg and a second leg.

3. The heat sink as defined by claim 2, wherein the first heat sink portion has guide elements for guiding the at least one component.

4. The heat sink as defined by claim 1, wherein the first heat sink portion has guide elements for guiding the at least one component.

5. The heat sink as defined by claim 2, wherein the contact face is disposed on an inner side of at least one of the first leg or the second leg.

6. The heat sink as defined by claim 2, wherein the at least one component can be clamped between the first leg and the second leg.

7. The heat sink as defined by claim 2, wherein the contact face is disposed on an outer side of one of the first leg or the second leg.

8. The heat sink as defined by claim 7, wherein in the mounted state, the at least one component can be clamped between the contact face on the outer side of one of the first leg or the second leg and a clamping portion.

9. The heat sink as defined by claim 1, wherein one or more further electrical components are disposed on one or more outer sides of the first heat sink portion.

* * * * *